US012701835B2

(12) United States Patent
Furuta

(10) Patent No.: US 12,701,835 B2
(45) Date of Patent: Aug. 4, 2026

(54) LIGHT SOURCE DEVICE HAVING RING-LIKE BLOCKING PORTION

(71) Applicant: OLYMPUS MEDICAL SYSTEMS CORP., Tokyo (JP)

(72) Inventor: Koichiro Furuta, Toyko (JP)

(73) Assignee: OLYMPUS MEDICAL SYSTEMS CORP., Tokyo (JP)

( * ) Notice: Subject to any disclaimer, the term of this patent is extended or adjusted under 35 U.S.C. 154(b) by 517 days.

(21) Appl. No.: 18/208,653

(22) Filed: Jun. 12, 2023

(65) Prior Publication Data

US 2023/0327060 A1 Oct. 12, 2023

Related U.S. Application Data

(63) Continuation of application No. PCT/JP2021/008609, filed on Mar. 5, 2021.

(51) Int. Cl.
H10H 20/855 (2025.01)
H10W 90/00 (2026.01)

(52) U.S. Cl.
CPC .......... H10H 20/855 (2025.01); H10W 90/00 (2026.01)

(58) Field of Classification Search
CPC ... A61B 1/0661; H01L 25/167; H01S 5/0683; H05B 45/22; H10B 80/00; H10K 39/10; H10K 59/90; H10K 59/95; H10N 19/00; H10N 39/00; H10N 59/00; H10N 69/00; H10N 79/00; H10N 89/00

(Continued)

(56) References Cited

U.S. PATENT DOCUMENTS

| 2017/0105258 A1* | 4/2017 | Sakai | ................... A61B 1/0661 |
| 2019/0280458 A1 | 9/2019 | Dykaar | |
| 2021/0285609 A1 | 9/2021 | Tabata et al. | |

FOREIGN PATENT DOCUMENTS

| EP | 3 205 258 A1 | 8/2017 |
| JP | H11-258523 A | 9/1999 |

(Continued)

OTHER PUBLICATIONS

International Search Report dated Apr. 20, 2021 received in PCT/JP2021/008609.

(Continued)

*Primary Examiner* — Ratisha Mehta
*Assistant Examiner* — Mikka Liu
(74) *Attorney, Agent, or Firm* — Scully, Scott, Murphy & Presser, P.C.

(57) ABSTRACT

A light source device includes: a first and second light sources respectively emitting a first and second light beams spectra of which are different from each other; an element guiding the first and second light beams to a common optical path; a first and second sensors respectively detecting light quantities of the first and second light beams; and a controller controlling, on the basis of the detected light quantities, the light quantities of the first and second light beams. The element guides the first light beam to the path by reflecting the first light beam, the first sensor is disposed in the path, the device further includes a first and second members respectively blocking a first and second regions respectively corresponding to portions of the first and second light beams, the first sensor is disposed in the second region, and the second sensor is disposed in the first region.

8 Claims, 7 Drawing Sheets

(58) Field of Classification Search
USPC ...................................................... 257/88–89
See application file for complete search history.

(56) References Cited

FOREIGN PATENT DOCUMENTS

| JP | 2006-006803 | A | 1/2006 | |
| JP | 4476036 | B2 | 6/2010 | |
| JP | 2012-125492 | A | 7/2012 | |
| JP | 2015-169691 | A | 9/2015 | |
| JP | 2018-000228 | A | 1/2018 | |
| WO | 2015/133425 | A1 | 9/2015 | |
| WO | 2016/056459 | A1 | 4/2016 | |
| WO | 2018/003241 | A1 | 1/2018 | |
| WO | WO-2019167298 | A1 * | 9/2019 | ............ H04N 23/74 |
| WO | 2020/115807 | A1 | 6/2020 | |

OTHER PUBLICATIONS

"Dichroic Mirror", Koshin Kogaku Co., Ltd., Kanagawa, Japan. Originally retrieved in Jan. 2021 from URL:http://www.yamaichi. co.jp/products/tabid/109/pdid/357/Default.aspx After that, the URL has been changed to URL:https://www.koshin-kogaku.co.jp/products/ filters/dichroic-mirror/.
"Story of Light and Color Part 2", CCS Inc., Kyoto, Japan Retrieved from the Internet in Jan. 2021, URL: https://www.ccs-inc.co.jp/ guide/column/light_color_part2/vol09.html.

* cited by examiner

LIGHT SOURCE DEVICE HAVING RING-LIKE BLOCKING PORTION

This is a continuation of International Application PCT/JP2021/008609 which is hereby incorporated by reference herein in its entirety.

TECHNICAL FIELD

The present invention relates to a light source device.

BACKGROUND ART

The light quantity of light emitted from a light source in a light source device changes due to the influence of temperature changes, etc. There is a known light source device in which the light quantity of a light source thereof is controlled by means of feedback control in order to maintain the light quantity of output light output to the exterior from the light source device constant regardless of the influence of temperature changes, etc. (for example, see Patent Literature 1).

The light source device of Patent Literature 1 includes a white light source, a laser light source, a dichroic mirror that combines a white-light optical path and a laser-light optical path, a sensor that detects the light quantity of the laser light, and a control unit, wherein the control unit controls, on the basis of the light quantity detected by the sensor, the amount of current input to the laser light source.

CITATION LIST

Patent Literature

{PTL 1} Publication of Japanese Patent No. 4476036

SUMMARY OF INVENTION

An aspect of the present invention is a light source device including: a first light source that emits a first light beam; a second light source that emits a second light beam, wherein a spectrum of the second light beam is different from a spectrum of the first light beam; an optical-path conversion element that includes a dichroic mirror and that respectively guides the first light beam and the second light beam to a common optical path; a first sensor that detects a light quantity of the first light beam; a second sensor that detects a light quantity of the second light beam; and a controller that controls, on the basis of the light quantity detected by the first sensor and the light quantity detected by the second sensor, the light quantity of the first light beam of the first light source and the light quantity of the second light beam of the second light source, wherein the optical-path conversion element guides the first light beam to the common optical path by reflecting the first light beam, the first sensor is disposed in the common optical path, the light source device further includes: a first blocking member that is disposed between the first light source and the optical-path conversion element and that blocks a first blocked region, which is a region corresponding to a portion of the first light beam; and a second blocking member that is disposed between the second light source and the optical-path conversion element and that blocks a second blocked region, which is a region corresponding to a portion of the second light beam, the first sensor is disposed in the second blocked region, and the second sensor is disposed in the first blocked region.

DESCRIPTION OF EMBODIMENTS

First Embodiment

A light source device according to a first embodiment of the present invention will be described with reference to the drawings.

Figure 1:
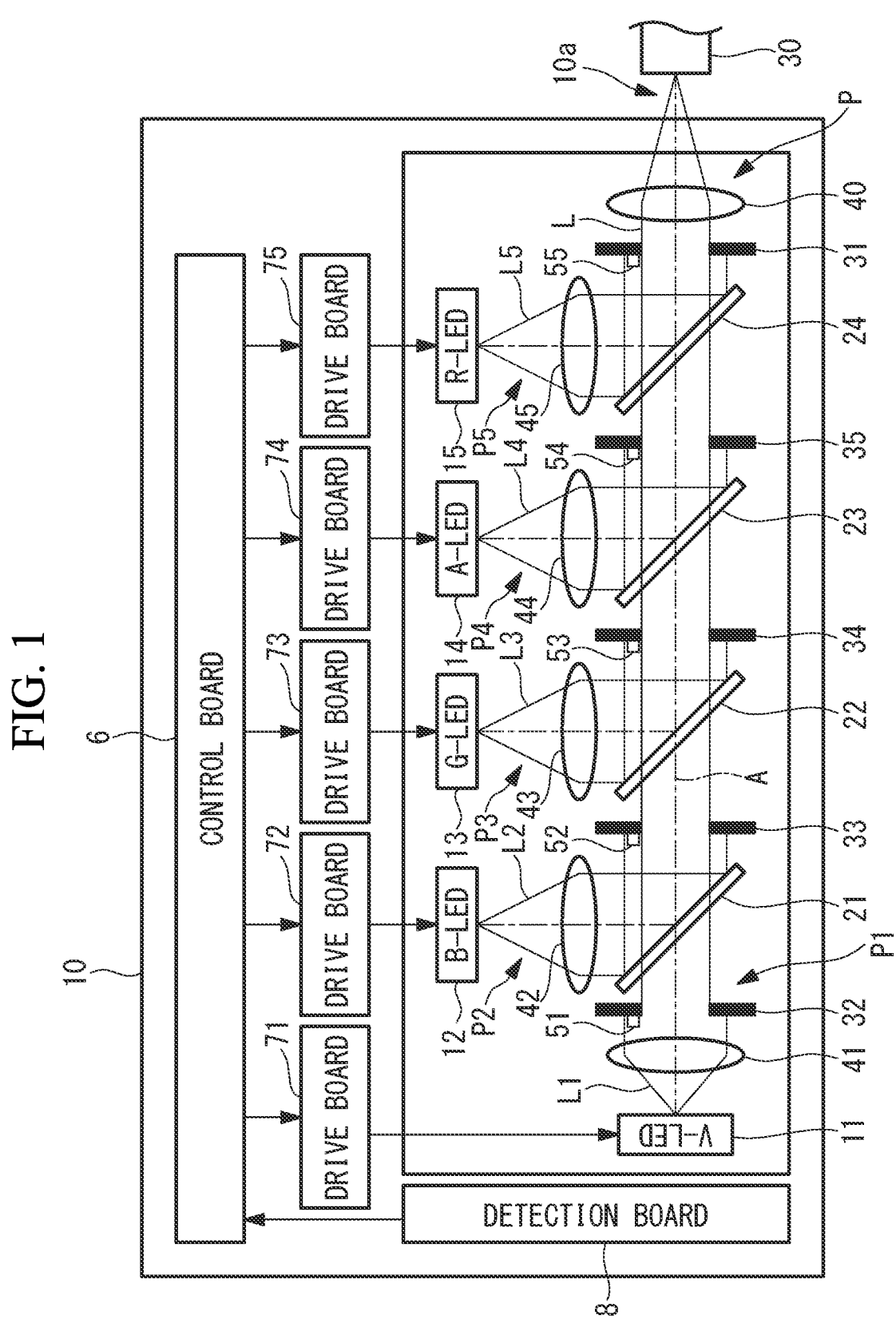
FIG. 1 is an overall configuration diagram of a light source device according to a first embodiment.

As shown in FIG. 1, a light source device 10 according to this embodiment generates, by combining a plurality of light beams emitted from a plurality of light sources, an output light beam L having a desired color and spectrum and outputs the output light beam L to the exterior of the light source device 10 from an outlet 10a. For example, the light source device 10 is connected to an endoscope 30 and the output light beam L is used as illumination light that illuminates the viewing field of the endoscope 30.

In this embodiment, a case in which five light sources 11, 12, 13, 14, and 15 are included will be described; however, the number of light sources may be an arbitrary number equal to or greater than 2.

The light source device 10 includes: the five light sources 11, 12, 13, 14, and 15; optical-path conversion elements 21, 22, 23, and 24 that guide, to a common optical path P, light beams L1, L2, L3, L4, and L5 respectively emitted from the light sources 11, 12, 13, 14, and 15; an aperture stop (limiting member) 31 disposed in the common optical path P; five collimating elements 41, 42, 43, 44, and 45 that respectively convert the light beams L1, L2, L3, L4, and L5 to collimated light beams; five sensors 51, 52, 53, 54, and 55 that respectively detect the light quantities of the light beams L1, L2, L3, L4, and L5; and a control board (control unit) 6 that controls the light sources 11, 12, 13, 14, and 15.

The common optical path P is an optical path through which all of the five light beams L1, L2, L3, L4, and L5 pass, in other words, the common optical path P is an optical path through which the output light beam L passes, and the outlet 10a is provided in the common optical path P or in an extension of the common optical path P. Arbitrary optical elements, such as a lens 40 that converts the output light beam L to a converging light beam and a filter that cuts light in a specific wavelength, may be disposed in the common optical path P.

The light sources 11, 12, 13, 14, and 15 are LED (light-emitting diode) light sources and respectively emit violet, blue, green, amber, and red light beams L1, L2, L3, L4, and L5. In the following, the light sources 11, 12, 13, 14, and 15 will be referred to as V-LED, B-LED, G-LED, A-LED, and R-LED, respectively.

The optical-path conversion elements 21, 22, 23, and 24 are dichroic mirrors, combine optical paths P1, P2, P3, P4, and P5 of the five light beams L1, L2, L3, L4, and L5 by allowing the light beams L1, L2, L3, L4, and L5 that are incident thereon to pass therethrough or reflecting said light beams, and thus, guide the light beams L1, L2, L3, L4, and L5 to the common optical path P.

Specifically, optical paths of the four LEDs 12, 13, 14, and 15 are parallel to each other and intersect an optical axis A of the V-LED 11. The four LEDs 12, 13, 14, and 15 are arranged in order of the wavelengths thereof, and the B-LED 12 having a low wavelength is disposed on a side close to the V-LED 11.

The optical-path conversion element 21 is disposed at a position at which the optical axis A and an optical axis of the B-LED 12 intersect each other, allows the violet light beam L1 to pass therethrough along the optical axis A, and reflects the blue light beam L2 along the optical axis A.

The optical-path conversion element 22 is disposed at a position at which the optical axis A and an optical axis of the G-LED 13 intersect each other, allows the violet and blue light beams L1 and L2 to pass therethrough along the optical axis A, and reflects the green light beam L3 along the optical axis A.

The optical-path conversion element 23 is disposed at a position at which the optical axis A and an optical axis of the A-LED 14 intersect each other, allows the violet, blue, and green light beams L1, L2, and L3 to pass therethrough along the optical axis A, and reflects the amber light beam L4 along the optical axis A.

The optical-path conversion element 24 is disposed at a position at which the optical axis A and an optical axis of the R-LED 15 intersect each other, allows the violet, blue, green, and amber light beams L1, L2, L3, and L4 to pass therethrough along the optical axis A, and reflects the red light beam L5 along the optical axis A.

Therefore, the common optical path P is an optical path between the optical-path conversion element 24 and the outlet 10a.

Figure 2:
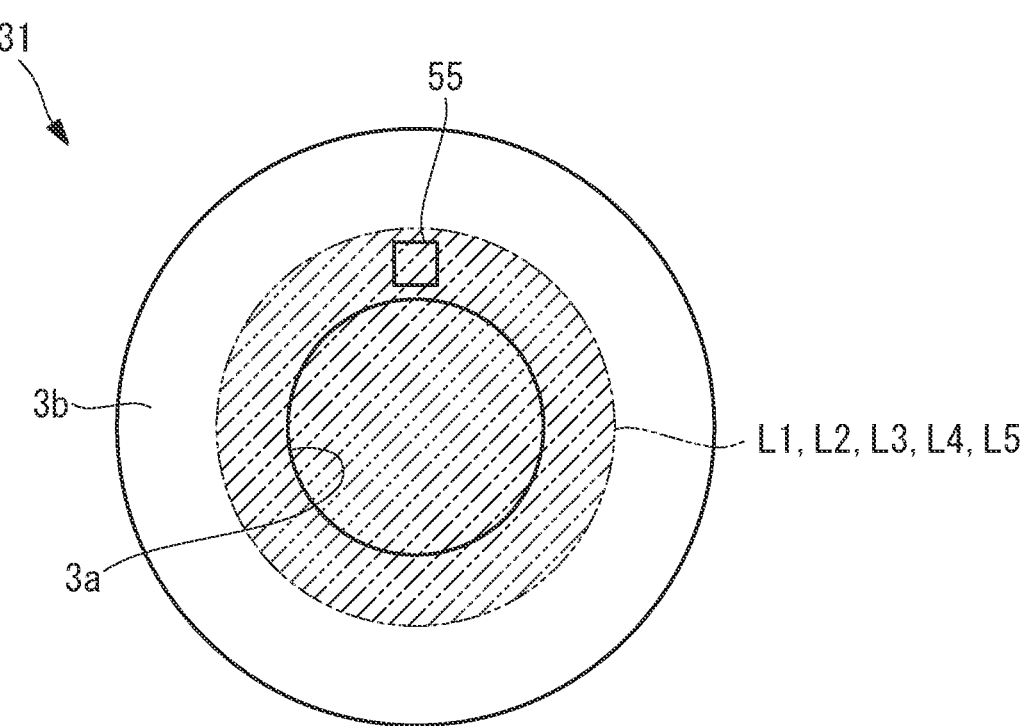
FIG. 2 is a diagram in which an aperture stop in a common optical path of the light source device in FIG. 1 is viewed from an incident side.

As shown in FIG. 2, the aperture stop 31 is a ring-like member and has: an opening 3a that is disposed on the optical axis of the common optical path P and through which the output light beam L passes; and a ring-like blocking portion 3b that surrounds the opening 3a and that blocks the output light beam L. The aperture stop 31 limits the passage of the output light beam L so that the output light beam L passes through only the opening 3a.

The collimating elements 41, 42, 43, 44, and 45 are respectively disposed between the corresponding light sources 11, 12, 13, 14, and 15 and the aperture stop 31. The light beams L1, L2, L3, L4, and L5 emitted from the LEDs 11, 12, 13, 14, and 15 are diverging light beams. The collimating elements 41, 42, 43, 44, and 45 respectively convert the light beams L1, L2, L3, L4, and L5 to collimated light beams having larger diameters than the diameter of the opening 3a. The diameters of the collimated light beams of the light beams L1, L2, L3, L4, and L5 may be the same as each other or may differ from each other. Therefore, as shown in FIG. 2, of the respective light beams L1, L2, L3, L4, and L5, luminous fluxes that are in a center portion and that pass through the opening 3a form the output light beam, and luminous fluxes in radially outer portions corresponding to the blocking portion 3b do not pass through the opening 3a and are not used in the output light beam.

Specifically, the collimating element 41 is disposed in the optical path P1 between the V-LED 11 and the optical-path conversion element 21 and converts the violet light beam L1 to a collimated light beam.

The collimating element 42 is disposed in the optical path P2 between the B-LED 12 and the optical-path conversion element 21 and converts the blue light beam L2 to a collimated light beam.

The collimating element 43 is disposed in the optical path P3 between the G-LED 13 and the optical-path conversion element 22 and converts the green light beam L3 to a collimated light beam.

The collimating element 44 is disposed in the optical path P4 between the A-LED 14 and the optical-path conversion element 23 and converts the amber light beam L4 to a collimated light beam.

The collimating element 45 is disposed in the optical path P5 between the R-LED 15 and the optical-path conversion element 24 and converts the red light beam L5 to a colli- mated light beam.

The respective collimating elements 41, 42, 43, 44, and 45 are preferably lenses. Each of the collimating elements 41, 42, 43, 44, and 45 in FIG. 1 consists of a single convex lens. Despite the small size thereof, a lens is capable of converting a diverging light beam to a collimated light beam. Therefore, as a result of using lenses as the collimating elements 41, 42, 43, 44, and 45, it is possible to reduce the size of the light source device 10.

The respective collimating elements 41, 42, 43, 44, and 45 may be optical elements other than convex lenses and may be, for example, tapered rods. In addition, the respective collimating elements 41, 42, 43, 44, and 45 may be config- ured by combining a plurality of optical elements.

The sensors 51, 52, 53, 54, and 55 are arbitrary sensors capable of detecting the light quantities of the light beams, and are, for example, photodiodes. The sensors 51, 52, 53, 54, and 55 respectively detect the light quantities of the light beams L1, L2, L3, L4, and L5 emitted from the correspond- ing light sources 11, 12, 13, 14, and 15.

Here, the light beams L2, L3, L4, and L5 are respectively reflected by the optical-path conversion elements 21, 22, 23, and 24. Each of the sensors 52, 53, 54, and 55 is disposed on an emission side (common optical path P side) of the optical-path conversion element 21, 22, 23, or 24 that reflects the light beams L2, L3, L4, or L5, which is the detection target, and detects the light quantity of the reflected light beams L2, L3, L4, or L5. Because the violet light beam L1 passes through all of the optical-path con- version elements 21, 22, 23, and 24, the sensor 51 is disposed at some position between the V-LED 11 and the outlet 10a.

In addition, the sensors 51, 52, 53, 54, and 55 are disposed at positions for respectively detecting, of the light beams L1, L2, L3, L4, and L5, the light quantities of portions thereof that do not pass through the opening 3a of the aperture stop 31. Specifically, the sensors 51, 52, 53, 54, and 55 are respectively disposed at positions at which, of the light beams L1, L2, L3, L4, and L5, radially outer portions thereof corresponding to the blocking portion 3b are made incident.

In FIG. 1, in addition to the aperture stop 31, four aperture stops 32, 33, 34, and 35 are provided. Each of the aperture stops 32, 33, 34, and 35 has the same configuration as the aperture stop 31 and has the opening 3a and the blocking portion 3b. Each of the aperture stops 32, 33, 34, and 35 is disposed on an incident side (V-LED 11 side) of the optical- path conversion element 21, 22, 23, or 24. Accordingly, only the violet light beam L1 is made incident on the blocking portion 3*b* of the aperture stop 32; only the blue light beam L2 is made incident on the blocking portion 3*b* of the aperture stop 33; only the green light beam L3 is made incident on the blocking portion 3*b* of the aperture stop 34; only the amber light beam L4 is made incident on the blocking portion 3*b* of the aperture stop 35; and only the red light beam L1 is made incident on the blocking portion 3*b* of the aperture stop 31.

Each of the sensors 51, 52, 53, 54, and 55 is disposed on an incident side of the aperture stop 32, 33, 34, 35, or 31, and only the light beams L1, L2, L3, L4, and L5, which are the detection targets, are made incident on the respective sensors 51, 52, 53, 54, and 55. Therefore, sensors having sensitivities for a wide range of wavelengths can be used as the sensors 51, 52, 53, 54, and 55. The sensors 51, 52, 53, 54, and 55 may be respectively secured on incident-side surfaces of the aperture stops 32, 33, 34, 35, and 31.

In the case in which sensors that have sensitivities only for wavelength bands of the light beams L1, L2, L3, L4, and L5, which are the detection targets, are used as the sensors 51, 52, 53, 54, and 55, the aperture stops 32, 33, 34, and 35 may be omitted, and the sensors 51, 52, 53, 54, and 55 may be disposed at arbitrary positions at which the radially outer portions of the light beams L1, L2, L3, L4, and L5, which are the detection targets, are made incident.

The control board 6 is connected to the LEDs 11, 12, 13, 14, and 15 via drive boards 71, 72, 73, 74, and 75 and is connected to the sensors 51, 52, 53, 54, and 55 via a detection board 8. The control board 6 controls the light quantities of the LEDs 11, 12, 13, 14, and 15 via the drive boards 71, 72, 73, 74, and 75 on the basis of the light quantities of the light beams L1, L2, L3, L4, and L5 detected by the sensors 51, 52, 53, 54, and 55.

Specifically, information about the light quantities (detected light quantities) detected by the sensors 51, 52, 53, 54, and 55 is input to the control board 6 via the detection board 8. The control board 6 stores target light quantities corresponding to the respective LEDs 11, 12, 13, 14, and 15. The drive boards 71, 72, 73, 74, and 75 respectively supply the LEDs 11, 12, 13, 14, and 15 with currents for causing the LEDs 11, 12, 13, 14, and 15 to emit light. The control board 6 controls, on the basis of the detected light quantities, current quantities supplied to the LEDs 11, 12, 13, 14, and 15 by the drive boards 71, 72, 73, 74, and 75, consequently performs feedback control of the light quantities of the LEDs 11, 12, 13, 14, and 15, and matches the detected light quantities with the target light quantities. Such control is realized by means of, for example, a control circuit formed on the control board 6.

Next the operation of the light source device 10 will be described.

With the light source device 10 of this embodiment, the light beams L1, L2, L3, L4, and L5 emitted from the LEDs 11, 12, 13, 14, and 15 are guided to the single common optical path P by the optical-path conversion elements 21, 22, 23, and 24, and form the output light beam L in the common optical path P. The output light beam L traveling in the common optical path P is output to the exterior of the light source device 10 from the outlet 10*a*.

Inside the light source device 10, the light quantities of the light beams L1, L2, L3, L4, and L5 are respectively detected by the sensors 51, 52, 53, 54, and 55, and the detected light quantities of the respective light beams L1, L2, L3, L4, and L5 are transmitted to the control board 6 via the detection board 8. The control board 6 compares the detected light quantities of the respective light beams L1, L2, L3, L4, and L5 with the corresponding target light quantities and performs the feedback control of the LEDs 11, 12, 13, 14, and 15 on the basis of differences between the detected light quantities and the target light quantities. Accordingly, the respective light quantities of the light beams L1, L2, L3, L4, and L5 contained in the output light beam L are controlled so as to achieve the prescribed target light quantities, and thus, the light quantity, the color, and the spectrum of the output light beam L are controlled so as to achieve the prescribed light quantity, color, and spectrum.

Figure 3:
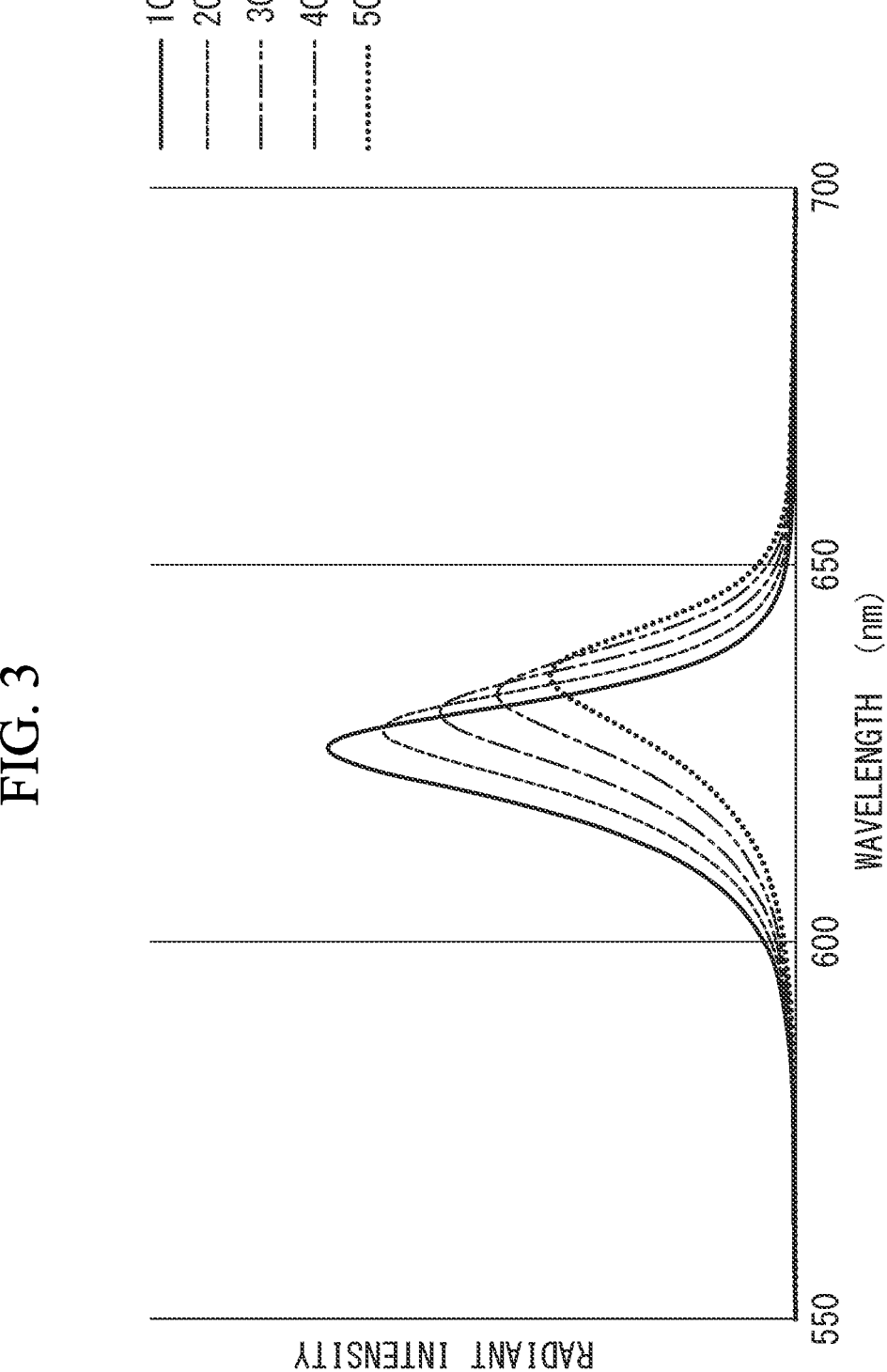
FIG. 3 is a diagram for explaining a spectral change in light emitted from an LED of the light source device in FIG. 1.
Figure 4:
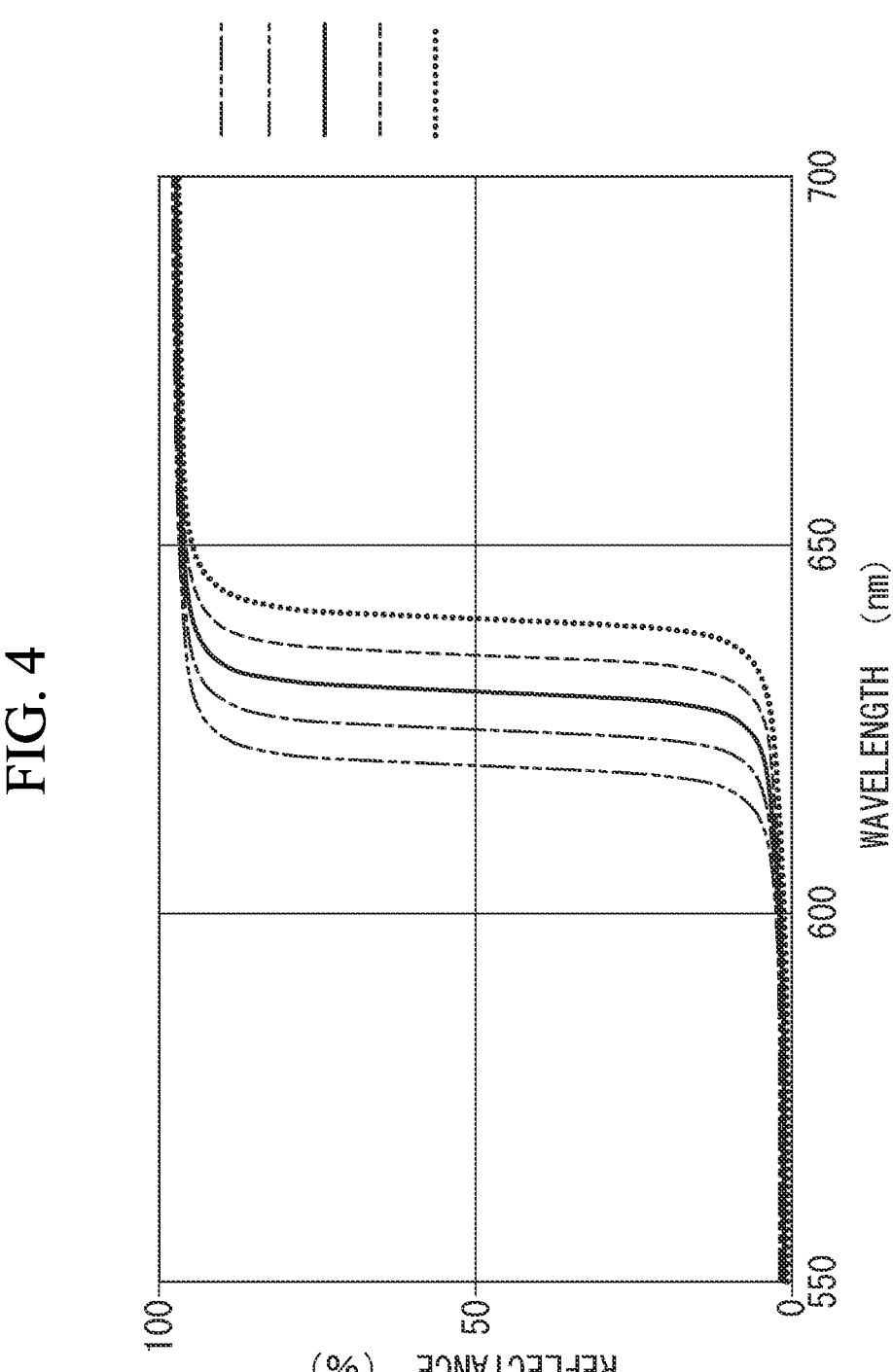
FIG. 4 is a diagram showing reflection characteristics of an optical-path conversion element of the light source device in FIG. 1.

In this case, as shown in FIG. 3, there are cases in which spectral changes, such as peak wavelength shifts, occur in the light beams L1, L2, L3, L4, and L5 emitted from the respective LEDs 11, 12, 13, 14, and 15 due to the influence of temperature changes, etc. FIG. 3 shows an example of an emission spectral change of the R-LED 15 when the room temperature is changed from 10° C. to 50° C. while supplying a constant current to the R-LED 15. With an increase in the temperature, the peak wavelength shifts toward high wavelengths and the peak intensity decreases. In addition, as shown in FIG. 4, the reflection characteristics of the optical-path conversion elements 21, 22, 23, and 24 are wavelength dependent. FIG. 4 shows an example of the reflection characteristics of a dichroic mirror in the case in which light is made incident on the dichroic mirror, serving as the optical-path conversion element 24, in the range of 45°±10°. For example, when the peak wavelength of the red light beam L5 made incident on the dichroic mirror changes from 630 nm to 640 nm, the reflectance of the dichroic mirror for the light beam L5 considerably changes.

Therefore, in association with spectral changes of the light beams L1, L2, L3, L4, and L5, the light quantities of the light beams L2, L3, L4, and L5 reflected by the optical-path conversion elements 21, 22, 23, and 24 also change. In other words, in association with the spectral changes, the correlations between the light quantities of the light beams L1, L2, L3, L4, and L5 emitted from the LEDs 11, 12, 13, 14, and 15 and the light quantities of the light beams L1, L2, L3, L4, and L5 contained in the output light beam L change.

With this embodiment, each of the sensors 52, 53, 54, and 55 is disposed on the emission side of the optical-path conversion element 21, 22, 23, or 24, and detects the light quantity of the light beam L2, L3, L4, or L5 reflected by the optical-path conversion element 21, 22, 23, or 24. Therefore, the detected light quantities closer to the light quantities of the light beams L2, L3, L4, and L5 contained in the output light beam L are obtained. It is possible to perform, on the basis of such detected light quantities, the feedback control of the light quantities of the respective LEDs 11, 12, 13, 14, and 15 with high precision, and it is possible to control the light quantity and color of the output light beam L with high precision so as to achieve the prescribed light quantity and color. Therefore, in the case in which the output light beam L is used as illumination light for the endoscope 30, it is possible to illuminate the viewing field thereof with illumination light having constant brightness and color regardless of the influence of temperature changes, etc.

In addition, the respective sensors 51, 52, 53, 54, and 55 detect, of the light beams L1, L2, L3, L4, and L5 emitted from the corresponding LEDs 11, 12, 13, 14, and 15, the light quantities of the portions thereof that do not pass through the aperture stop 31 and that are not used as the output light beam L. Accordingly, it is possible to detect the light quantities of the respective light beams L1, L2, L3, L4, and L5 while preventing a reduction in the light quantity of the output light beam L.

In this embodiment, the LEDs 11, 12, 13, 14, and 15 are disposed so as to be farther away from the common optical path P in accordance with a decrease in the wavelengths thereof; however, the arrangement of the LEDs 11, 12, 13, 14, and 15 is not limited thereto, and the LEDs 11, 12, 13, 14, and 15 may be disposed in an arbitrary order.

The magnitude of spectral changes differs in each of the light beams L1, L2, L3, L4, and L5. In addition, the transmission characteristics of the optical-path conversion elements 21, 22, 23, and 24 are wavelength dependent, as with the reflection characteristics. Therefore, in order to reduce the number of times light beams having large spectral changes pass through the optical-path conversion elements, it is preferable that LEDs that emit light beams having large spectral changes be disposed at positions closer to the common optical path P. For example, the arrangement in FIG. 1 is effective in the case in which peak wavelength shifts of the amber and red light beams L4 and L5 are greater than peak wavelength shifts of the violet, blue, and green light beams L1, L2, and L3.

Second Embodiment

Next, a light source device according to a second embodiment of the present invention will be described with reference to the drawings.

Figure 5:
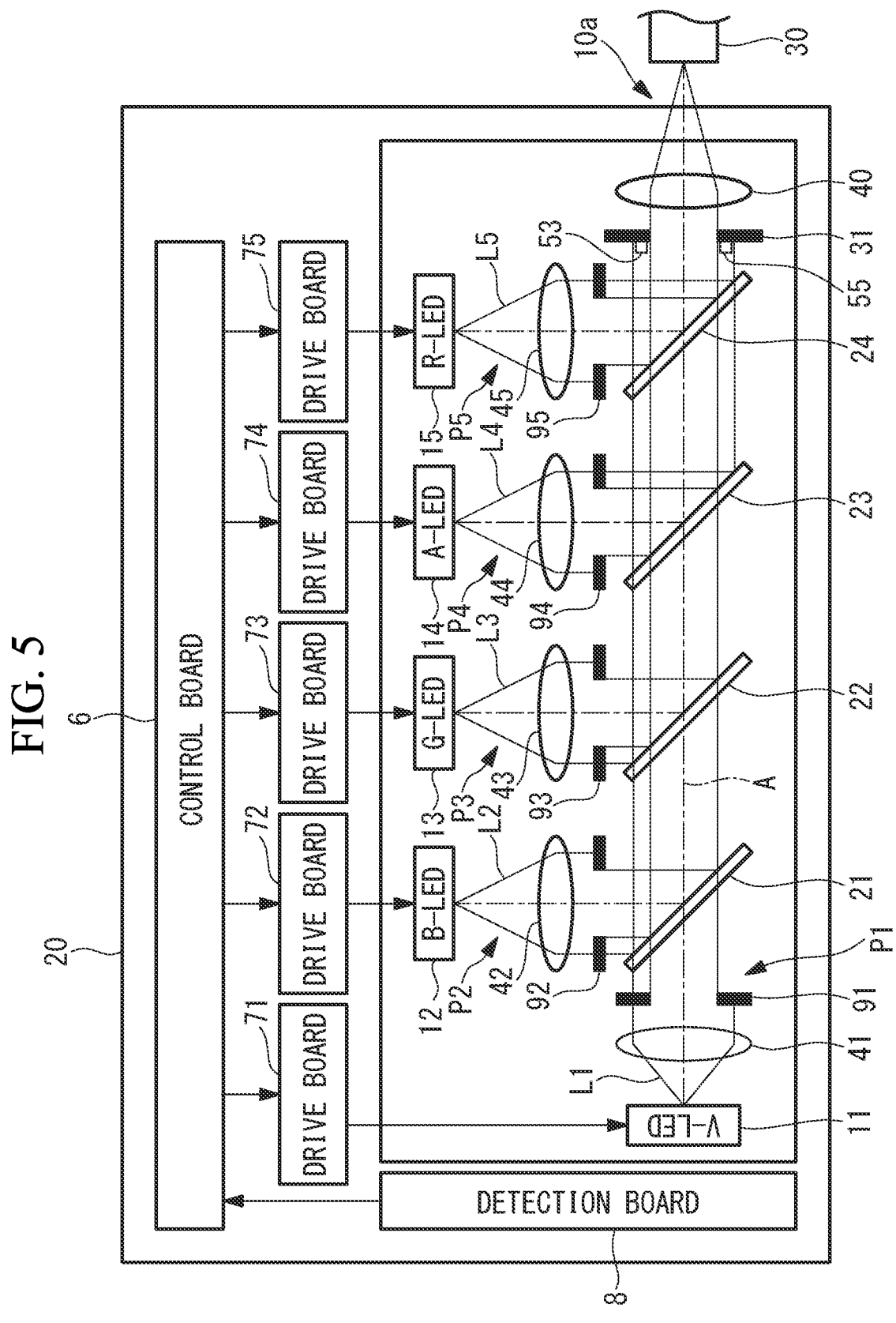
FIG. 5 is an overall configuration diagram of a light source device according to a second embodiment.

As shown in FIG. 5, a light source device 20 according to this embodiment and the light source device 10 of the first embodiment differ from each other in that the light source device 20 includes blocking members 91, 92, 93, 94, and 95 instead of the aperture stops 32, 33, 34, and 35 and that all of the sensors 51, 52, 53, 54, and 55 are disposed in the common optical path P. In FIG. 5, of the five sensors 51, 52, 53, 54, and 55, only the sensors 53 and 55 are shown. In this embodiment, the same configurations as the first embodiment are given the same reference signs, and the descriptions thereof will be omitted.

The light source device 20 includes: the LEDs 11, 12, 13, 14, and 15; the optical-path conversion elements 21, 22, 23, and 24; the aperture stop 31; the collimating elements 41, 42, 43, 44, and 45; the sensors 51, 52, 53, 54, and 55; the control board 6; and the five blocking members 91, 92, 93, 94, and 95.

Figure 6:
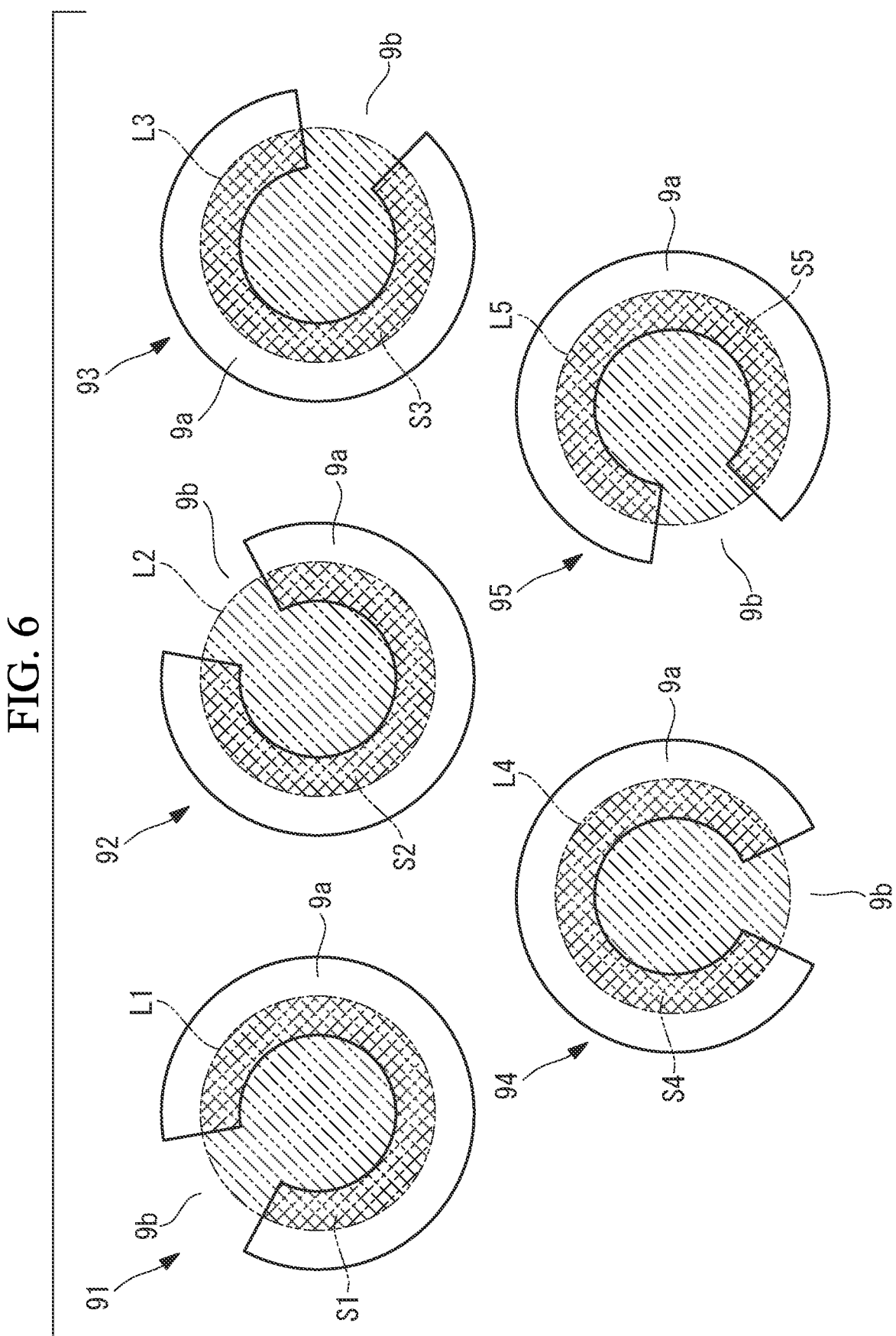
FIG. 6 is a diagram in which a plurality of blocking members of the light source device in FIG. 5 are viewed from an incident side of each of the blocking members.

FIG. 6 is a diagram in which each of the blocking members 91, 92, 93, 94, and 95 is viewed from an incident side (LED 11, 12, 13, 14, or 15 side). As shown in FIG. 6, each of the blocking members 91, 92, 93, 94, and 95 is a partially ring-like (C-shaped) flat plate member in which a portion thereof in a circumferential direction is cut out, and has: a partially ring-like blocking portion 9a that blocks the light beam L1, L2, L3, L4, or L5; and a passage portion 9b that is formed from the cut-out portion and that allows the light beam L1, L2, L3, L4, or L5 to pass therethrough. A passage portion 9b having an arbitrary shape may be formed in a portion in the circumferential direction of a blocking portion 9a having a complete ring shape.

Each of the blocking members 91, 92, 93, 94, and 95 is disposed, in the optical path P1, P2, P3, P4, or P5, on an emission side of the collimating element 41, 42, 43, 44, or 45. The inner diameter of the blocking portions 9a is smaller than the diameters of the collimated light beams of the light beams L1, L2, L3, L4, and L5. Therefore, of the light beams L1, L2, L3, L4, and L5 respectively made incident on the blocking members 91, 92, 93, 94, and 95, portions thereof pass through inside the blocking portions 9a and the passage portions 9b, and the other portions thereof are blocked by the blocking portions 9a. In FIG. 6, cross hatched regions represent blocked regions S1, S2, S3, S4, and S5 blocked by the blocking portions 9a.

Figure 7:
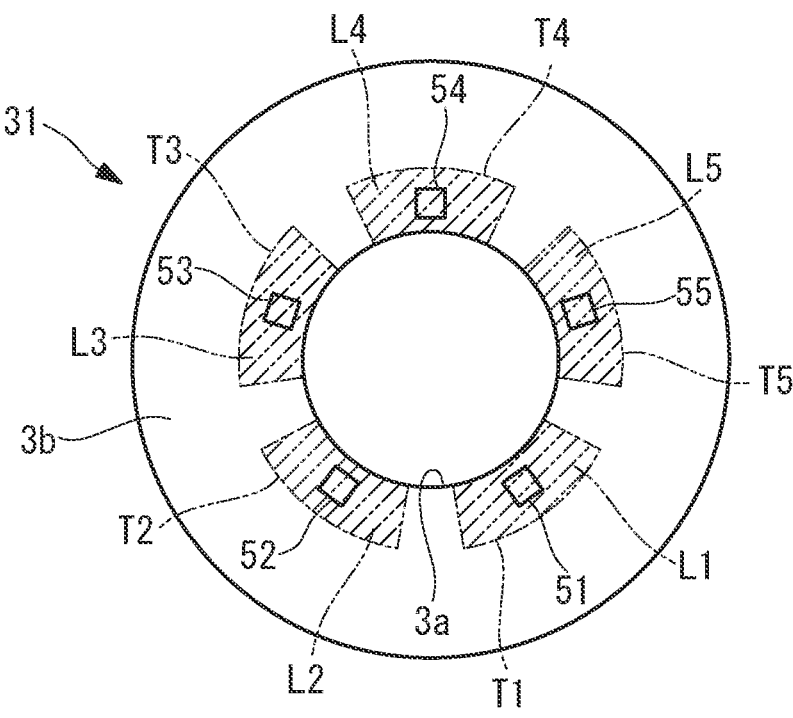
FIG. 7 is a diagram in which an aperture stop and sensors in a common optical path of the light source device in FIG. 5 are viewed from an incident side.

As shown in FIG. 6, the passage portions 9b of all of the blocking members 91, 92, 93, 94, and 95 are disposed at positions in the circumferential direction that are different from each other. In addition, in the case in which the blocking members 91, 92, 93, 94, and 95 are disposed in a direction along the optical axis so as to overlap with each other, in one of the passage portions 9b of the blocking members 91, 92, 93, 94, and 95, all of the other blocking portions 9a of the blocking members 91, 92, 93, 94, and 95 overlap with each other. Accordingly, as shown in FIG. 7, regions T1, T2, T3, T4, and T5 in which all of the blocked regions excluding the one blocked region overlap with each other are formed in the common optical path P. For example, the region T1 is a region in which the four blocked regions S2, S3, S4, and S5 excluding the blocked region S1 overlap with each other. In other words, each of the regions T1, T2, T3, T4, and T5 is a region irradiated only with one of the light beams L1, L2, L3, L4, and L5.

The sensors 51, 52, 53, 54, and 55 are respectively disposed in regions T1, T2, T3, T4, and T5. For example, sensors 51, 52, 53, 54, and 55 are secured on an incident side surface of the aperture stop 31. Therefore, it is possible to accurately detect the light quantities of the respective light beams L1, L2, L3, L4, and L5 by using the sensors 51, 52, 53, 54, and 55 having sensitivities for a wide range of wavelengths.

Next, the operation of the light source device 20 will be described.

With the light source device 20 of this embodiment, the light beams L1, L2, L3, L4, and L5 emitted from the LEDs 11, 12, 13, 14, and 15 form the output light beam L in the common optical path P and the output light beam L is output to the exterior of the light source device 10 from the outlet 10a, as with the light source device 10. In addition, as with the light source device 10, inside the light source device 20, the light quantities of the light beams L1, L2, L3, L4, and L5 are respectively detected by the sensors 51, 52, 53, 54, and 55, and the control board 6 performs the feedback control of the LEDs 11, 12, 13, 14, and 15 on the basis of the differences between the detected light quantities of the respective light beams L1, L2, L3, L4, and L5 and the target light quantities. Accordingly, the light quantities of the respective light beams L1, L2, L3, L4, and L5 contained in the output light beam L are controlled so as to achieve the prescribed target light quantities, and thus, the light quantity, the color, and the spectrum of the output light beam L are controlled so as to achieve the prescribed light quantity, color, and spectrum.

In this case, as has been described above, the transmission characteristics of the optical-path conversion elements 21, 22, 23, and 24 are wavelength dependent. Therefore, in association with spectral changes of the light beams L1, L2, L3, L4, and L5, the light quantities of the light beams L1, L2, L3, and L4 that have passed through the optical-path conversion elements 21, 22, 23, and 24 also change. In other words, in association with the spectral changes, the correlations between the light quantities of the light beams L1, L2, L3, L4, and L5 emitted from the LEDs 11, 12, 13, 14, and 15 and the light quantities of the light beams L1, L2, L3, L4, and L5 contained in the output light beam L change.

With this embodiment, the sensors 51, 52, 53, 54, and 55 are disposed in the common optical path P in a stage that is farther on the rear side than all of the optical-path conversion elements 21, 22, 23, and 24 and respectively detect the light quantities of the light beams L1, L2, L3, L4, and L5 that are reflected by the optical-path conversion elements 21, 22, 23, and 24 and that have passed through the optical-path conversion elements 21, 22, 23, and 24. Therefore, as compared with the first embodiment, the detected light quantities even closer to the light quantities of the light beams L1, L2, L3, L4, and L5 contained in the output light beam L are obtained. It is possible to perform, on the basis of such detected light quantities, the feedback control of the light quantities of the respective LEDs 11, 12, 13, 14, and 15 with higher precision, and it is possible to control the light quantity and the color of the output light beam L with higher precision so as to achieve the prescribed light quantity and color. Therefore, in the case in which the output light beam L is used as illumination light for the endoscope 30, it is possible to illuminate the viewing field thereof with illumination light having constant brightness and color regardless of the influence of temperature changes, etc.

In addition, the respective sensors 51, 52, 53, 54, and 55 detect, of the light beams L1, L2, L3, L4, and L5 emitted from the corresponding LEDs 11, 12, 13, 14, and 15, the light quantities of the portions thereof that do not pass through the aperture stop 31 and that are not used as the output light beam L. Accordingly, it is possible to detect the light quantities of the respective light beams L1, L2, L3, L4, and L5 while preventing a reduction in the light quantity of the output light beam L.

In this embodiment, in the case in which sensors having sensitivities only for the wavelength bands of the light beams L1, L2, L3, L4, and L5, which are the detection targets, are used as the sensors 51, 52, 53, 54, and 55, the blocking members 91, 92, 93, 94, and 95 may be omitted. In this case, the sensors 51, 52, 53, 54, and 55 may be disposed, in the common optical path P, at arbitrary positions at which the radially outer portions of the light beams L1, L2, L3, L4, and L5, which are the detection targets, are made incident.

In the above-described first and second embodiments, the LED light sources each emitting the light beam having a single color are employed as the plurality of light sources; however, the plurality of light sources may be arbitrary types of light sources so long as the plurality of light sources output light beams having different spectra from each other. For example, the plurality of light sources may include lamp light sources and may include laser light sources.

The following aspects can be also derived from the embodiments.

An aspect of the present invention is a light source device including: a first light source that emits a first light beam; a second light source that emits a second light beam, wherein a spectrum of the second light beam is different from a spectrum of the first light beam; an optical-path conversion element that respectively guides the first light beam and the second light beam to a common optical path; a first sensor that detects a light quantity of the first light beam; a second sensor that detects a light quantity of the second light beam; and a control unit that controls, on the basis of the light quantity detected by the first sensor and the light quantity detected by the second sensor, the light quantity of the first light beam of the first light source and the light quantity of the second light beam of the second light source, wherein the optical-path conversion element guides the first light beam to the common optical path by reflecting the first light beam, and the first sensor is disposed in the common optical path.

With this aspect, the first light beam emitted from the first light source and the second light beam emitted from the second light source are respectively guided by the optical-path conversion element to the common optical path, and the first light beam and the second light beam traveling in the common optical path are output as an output light beam to the exterior of the light source device from an exit thereof disposed in the common optical path or an extension of the common optical path.

In addition, the light quantities of the light beams emitted from the respective light sources are controlled by the control device by means of feedback control, on the basis the light quantity of the first light beam detected by the first sensor and the light quantity of the second light beam detected by the second sensor.

In this case, the first sensor detects the light quantity of the first light beam that has been reflected by the optical-path conversion element. Therefore, the detected light quantity of the first light beam becomes equal to or close to the light quantity of the first light beam contained in the output light beam regardless of spectral changes of the first light beam due to the influence of temperature changes, etc. It is possible to control, on the basis of such a detected light quantity, the light quantity and the color of the output light beam with high precision regardless of spectral changes of the first light beam emitted from the light source.

The above-described aspect may additionally include: a limiting member that is disposed in the common optical path; a first collimating element that is disposed between the first light source and the limiting member and that converts the first light beam to a collimated light beam having a first diameter; and a second collimating element that is disposed between the second light source and the limiting member and that converts the second light beam to a collimated light beam having a second diameter, wherein the limiting member may have an opening having a smaller diameter than the first diameter and the second diameter and may limit passages of the first light beam and the second light beam to only the opening, the first sensor may detect, of the first light beam, a light quantity of a portion thereof that does not pass through the opening, and the second sensor may detect, of the second light beam, a light quantity of a portion thereof that does not pass through the opening.

With this configuration, the sensors detect, of the light beams emitted from the respective light sources, the portions that are not used as the output light beam. Accordingly, it is possible to detect the light quantities of the respective light beams while preventing a reduction in the light quantity of the output light beam.

In the above-described aspect, the optical-path conversion element may guide the second light beam to the common optical path by allowing the second light beam to pass therethrough; and the second sensor may be disposed in the common optical path.

With this configuration, the second sensor detects the light quantity of the second light beam that has passed through the optical-path conversion element. Therefore, the detected light quantity of the second light beam becomes equal to or close to the light quantity of the second light beam contained in the output light beam regardless of spectral changes of the second light beam due to the influence of temperature changes, etc. It is possible to control, on the basis of such a detected light quantity, the light quantity and the color of output light beam with higher precision regardless of spectral changes of the second light beam emitted from the light source.

The above-described aspect may additionally include: a first blocking member that is disposed between the first light source and the optical-path conversion element and that blocks a first blocked region, which is a region corresponding to a portion of the first light beam; and a second blocking member that is disposed between the second light source and the optical-path conversion element and that blocks a second blocked region, which is a region corresponding to a portion of the second light beam, wherein the first sensor may be disposed in the second blocked region, and the second sensor may be disposed in the first blocked region.

With this configuration, because the first sensor is disposed in the second blocked region in which the second light beam is not made incident, it is possible to more accurately detect the light quantity of the first light beam. Therefore, the control unit can control the light quantity of the first light source with higher precision. In addition, because the second sensor is disposed in the first blocked region in which the first light beam is not made incident, it is possible to more accurately detect the light quantity of the second light beam. Therefore, the control unit can control the light quantity of the second light source with higher precision.

The above-described aspect may additionally include: a third light source that emits a third light beam, wherein a spectrum of the third light beam is different from the spectrum of the first light beam and the spectrum of the second light beam; a third sensor that is disposed in the common optical path and that detects a light quantity of the third light beam; and a third blocking member that is disposed between the third light source and the optical-path conversion element and that blocks a third blocked region, which is a region corresponding to a portion of the third light beam, wherein the optical-path conversion element may guide the third light beam to the common optical path by allowing the third light beam to pass therethrough, the first sensor may be disposed in a region in which all of blocked regions excluding the first blocked region overlap with each other, the second sensor may be disposed in a region in which all of the blocked regions excluding the second blocked region overlap with each other, and the third sensor may be disposed in a region in which all of the blocked regions excluding the third blocked region overlap with each other.

With this configuration, the third light beam is detected as the output light beam in addition to the first light beam and the second light beam. In this case, the first sensor is disposed in a region in which the second and third light beams are not made incident, the second sensor is disposed in a region in which the first and third light beams are not made incident, and the third sensor is disposed in a region in which the first and second light beams are not made incident. Accordingly, it is possible to more accurately detect the light quantities of the corresponding light beams by means of the respective sensors.

In the above-described aspect, each of the first collimating element and the second collimating element may be a lens.

Despite the small size thereof, a lens is capable of converting a diverging light beam emitted from a light source to a collimated light beam. Therefore, as a result of using lenses as the collimating elements, it is possible to reduce the size of the light source device.

In the above-described aspect, each of the first blocking member and the second blocking member may be a ring-like member; the first blocking member may have a ring-like or partially ring-like blocking portion and a passage portion that is provided in a portion in a circumferential direction of the first blocking member and that allows the first light beam to pass therethrough, and the second blocking member may have a ring-like or partially ring-like blocking portion and a passage portion that is provided in a portion in a circumferential direction of the second blocking member and that allows the second light beam to pass therethrough.

With this configuration, it is possible to use luminous fluxes passing through inside the ring-like or partially ring-like blocking members as the output light beam and to provide blocked regions in radially outer regions that are not used as the output light beam. In addition, as a result of detecting, by means of the sensors, light beams that pass through the passage portion and that are not used as the output light beam, it is possible to detect the light quantities of the respective light beams while preventing a reduction in the light quantity of the output light beam.

REFERENCE SIGNS LIST

10, 20 light source device
11, 12, 13 light source, LED (third light source)
14 light source, LED (second light source)
15 light source, LED (first light source)
21, 22, 23, 24 optical-path conversion element
31 aperture stop (limiting member)
3a opening
3b blocking portion
32, 33, 34, 35 aperture stop
41, 42, 43 collimating element (third collimating element)
44 collimating element (second collimating element)
45 collimating element (first collimating element)
51, 52, 53 sensor (third sensor)
54 sensor (second sensor)
55 sensor (first sensor)
6 control board (control unit)
71, 72, 73, 74, 75 drive board
8 detection board
91, 92, 93 blocking member (third blocking member)
94 blocking member (second blocking member)
95 blocking member (first blocking member)
9a blocking portion
9b passage portion
30 endoscope
A optical axis
L1, L2, L3 light beam (third light beam)
L4 light beam (second light beam)
L5 light beam (first light beam)
P common optical path
S1, S2, S3 blocked region (third blocked region)
S4 blocked region (second blocked region)
S5 blocked region (first blocked region)

The invention claimed is:

1. A light source device comprising:
a first light source configured to emit a first light beam;
a second light source configured to emit a second light beam, wherein a spectrum of the second light beam is different from a spectrum of the first light beam;
an optical-path conversion element that comprises a dichroic mirror and that respectively guides the first light beam and the second light beam to a common optical path;
a first sensor configured to detect a light quantity of the first light beam;
a second sensor configured to detect a light quantity of the second light beam; and
a controller comprising hardware, the controller being configured to control, based on the light quantity detected by the first sensor and the light quantity detected by the second sensor, the light quantity of the first light beam of the first light source and the light quantity of the second light beam of the second light source, wherein the optical-path conversion element guides the first light beam to the common optical path by reflecting the first light beam, the first sensor is disposed in the common optical path, the light source device further comprises:

a first blocking member that is disposed between the first light source and the optical-path conversion element and that blocks a first blocked region, which is a region corresponding to a portion of the first light beam; and a second blocking member that is disposed between the second light source and the optical-path conversion element and that blocks a second blocked region, which is a region corresponding to a portion of the second light beam, the first sensor is disposed in the second blocked region, and the second sensor is disposed in the first blocked region.

2. The light source device according to claim 1, further comprising:

a limiting member that is disposed in the common optical path;

a first collimating element that is disposed between the first light source and the limiting member and that converts the first light beam to a collimated light beam having a first diameter; and a second collimating element that is disposed between the second light source and the limiting member and that converts the second light beam to a collimated light beam having a second diameter, wherein the limiting member has an opening having a smaller diameter than the first diameter and the second diameter and limits passage of the first light beam and the second light beam to only the opening, the first sensor detects, of the first light beam, a light quantity of a portion thereof that does not pass through the opening, and the second sensor detects, of the second light beam, a light quantity of a portion thereof that does not pass through the opening.

3. The light source device according to claim 2, wherein each of the first collimating element and the second collimating element comprises a lens.

4. The light source device according to claim 2, wherein the limiting member is an aperture stop.

5. The light source device according to claim 1, wherein:

the optical-path conversion element guides the second light beam to the common optical path by allowing the second light beam to pass through the optical-path conversion element; and the second sensor is disposed in the common optical path.

6. The light source device according to claim 1, further comprising:

a third light source that emits a third light beam, wherein a spectrum of the third light beam is different from the spectrum of the first light beam and the spectrum of the second light beam;

a third sensor that is disposed in the common optical path and that detects a light quantity of the third light beam; and a third blocking member that is disposed between the third light source and the optical-path conversion element and that blocks a third blocked region, which is a region corresponding to a portion of the third light beam, wherein the optical-path conversion element guides the third light beam to the common optical path by allowing the third light beam to pass through the optical-path conversion element, the first sensor is disposed in a region in which all of blocked regions excluding the first blocked region overlap with each other, the second sensor is disposed in a region in which all of the blocked regions excluding the second blocked region overlap with each other, and the third sensor is disposed in a region in which all of the blocked regions excluding the third blocked region overlap with each other.

7. The light source device according to claim 6, wherein:

the third blocking member is a ring-like member;

the third blocking member has a ring-like or partially ring-like blocking portion and a passage that is provided in a portion in a circumferential direction of the third blocking member and that allows the third light beam to pass through the passage.

8. The light source device according to claim 1, wherein:

each of the first blocking member and the second blocking member is a ring-like member;

the first blocking member has a ring-like or partially ring-like blocking portion and a first passage that is provided in a portion in a circumferential direction of the first blocking member and that allows the first light beam to pass through the first passage, and the second blocking member has a ring-like or partially ring-like blocking portion and a second passage that is provided in a portion in a circumferential direction of the second blocking member and that allows the second light beam to pass through the second passage.

* * * * *